(12) United States Patent
Nakafuku

(10) Patent No.: US 6,545,386 B2
(45) Date of Patent: Apr. 8, 2003

(54) METHOD FOR ADJUSTING FREQUENCY OF PIEZOELECTRIC RESONATOR

(75) Inventor: Sachihito Nakafuku, Toyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/863,134

(22) Filed: May 23, 2001

(65) Prior Publication Data
US 2002/0068230 A1 Jun. 6, 2002

(30) Foreign Application Priority Data
Jul. 7, 2000 (JP) ........................................ 2000-206573

(51) Int. Cl.⁷ .............................................. H01L 41/08
(52) U.S. Cl. ........................................................ 310/312
(58) Field of Search ............................................ 310/312

(56) References Cited

U.S. PATENT DOCUMENTS

| | | | | |
|---|---|---|---|---|
| 4,092,588 A | * | 5/1978 | Desormiere et al. | 204/192.18 |
| 5,407,525 A | * | 4/1995 | Michel et al. | 156/345.24 |
| 5,662,782 A | * | 9/1997 | Gomi et al. | 204/192.34 |
| 5,996,199 A | * | 12/1999 | Ichikawa et al. | 29/25.35 |
| 6,307,299 B1 | * | 10/2001 | Suzuki et al. | 310/312 |
| 2001/0030293 A1 | * | 10/2001 | Mizuguchi et al. | 250/492.3 |
| 2002/0005676 A1 | * | 1/2002 | Greer | 310/312 |

FOREIGN PATENT DOCUMENTS

| | | | | |
|---|---|---|---|---|
| JP | 63-151103 | | 6/1988 | H03H/3/04 |
| JP | 4-196610 | * | 7/1992 | H03H/3/10 |
| JP | 2001-257549 | * | 9/2001 | H03H/3/04 |

* cited by examiner

Primary Examiner—Thomas M. Dougherty
(74) Attorney, Agent, or Firm—Keating & Bennett, LLP

(57) ABSTRACT

A method for adjusting the frequency of a piezoelectric resonator allows for frequency adjustments to be individually made for each of a plurality of elements disposed on a piezoelectric substrate before the resonator is completed. Moreover, the frequency adjustments can be made with high accuracy in a relatively short time. When adjusting the frequency of each element, an ion beam is irradiated onto a plurality of electrodes disposed on the piezoelectric substrate to etch the electrodes. The method includes the steps of determining a correlation between an ion-beam irradiation time and the amount of frequency changes, measuring the frequency of each element on the piezoelectric substrate, determining the amount of the frequency adjustment of the element based on a difference between the measured frequency and a target value, determining the ion-beam irradiation time for the element based on the determined amount of the frequency adjustment by using the correlation, and irradiating an ion beam onto the element during the determined irradiation time.

19 Claims, 6 Drawing Sheets

FIG. 5 transferring direction

METHOD FOR ADJUSTING FREQUENCY OF PIEZOELECTRIC RESONATOR

BACKGROUND OF THE INVENTION

1. Field of the Invention

The present invention relates to a method for adjusting the frequency of a piezoelectric resonator by irradiating an ion beam.

2. Description of the Related Art

Conventionally, as a method for adjusting the frequency of a piezoelectric resonator by irradiating an ion beam, as disclosed in Japanese Unexamined Patent Application Publication No. 63-151103, there is known a frequency adjustment method. In this method, a plurality of piezoelectric resonators is arranged on a cathode and a positive gas ion particle emitted from an anode is moved to the cathode. With this arrangement, etching is uniformly performed on the surfaces of the electrodes of the piezoelectric resonators to make rough adjustments. After the rough adjustments have been completed, an ion beam from an ion gun is irradiated onto each of the piezoelectric resonators to make fine adjustments.

In this case, during the fine adjustment phase, the ion-beam etching is performed while measuring the frequency of each element. Thus, the frequency can set to be close to a target frequency with high accuracy.

In this method, however, the frequency adjustment is performed by irradiating an ion beam onto the piezoelectric resonator when it is in the stage of an almost completed product. Consequently, when adjusting the frequencies of many piezoelectric resonators, it requires a great deal of time to individually position and retain the elements. Thus, there is a problem in terms of equipment performances.

Additionally, in the rough adjustment phase, since the ion beam is uniformly irradiated onto the plurality of piezoelectric resonators, variations in the frequencies of the elements are inevitably generated.

Furthermore, during the fine adjustment phase, after the irradiation of the ion beam is performed once, the frequency is measured. Sequentially, the ion beam irradiation is repeated. As a result, in order to make the frequency close to a target value, it is necessary to repeat the ion-beam irradiation and the frequency measurement many times. Thus, there is a problem in that it takes a great deal of time to make the frequency adjustment.

SUMMARY OF THE INVENTION

In order to overcome the problems described above, preferred embodiments of the present invention provide a method for adjusting the frequency of a piezoelectric resonator, in which the frequency of each of a plurality of elements disposed on a piezoelectric substrate can be adjusted before the completion of the resonator, with high accuracy in a relatively short time.

According to a preferred embodiment of the present invention, there is provided a method for adjusting the frequency of a piezoelectric resonator, in which the frequency of each of elements formed in a piezoelectric substrate is adjusted by irradiating an ion beam onto a plurality of electrodes provided on the piezoelectric substrate to etch the electrodes. The method includes the steps of determining a correlation between time for ion-beam irradiation and the amount of frequency changes, measuring the frequency of each of the elements disposed on the piezoelectric substrate, determining the amount of frequency adjustment for each element based on a difference between the measured frequency value and a target value, determining an ion-beam irradiation time for each element based on the determined amount of frequency adjustment by using the correlation, and irradiating an ion beam onto each element during the determined irradiation time.

First, the correlation between the time for irradiating an ion beam and the amount of frequency changes is determined. In this step, before the frequency of the piezoelectric resonator is actually adjusted, an ion beam is irradiated onto the electrodes. After this, the correlation between the ion-beam irradiation time and the amount of frequency changes is determined and stored as data. The stored data varies with the characteristics of an ion gun and the etching characteristics of the electrodes with respect to the ion beam.

Secondly, a frequency signal is input to each of the electrodes formed in insular forms on the piezoelectric substrate to measure the resonance frequency or anti-resonance frequency of each element defined by the mutually opposing electrodes provided on the upper and lower surfaces of the piezoelectric substrate and the piezoelectric substrate positioned therebetween. Then, based on the difference between the measured frequency value and the target value, the amount of frequency adjustment of each of the elements is determined. When the electrodes are arranged in a matrix on the piezoelectric substrate, it is preferable to store the data by correlating the positions of the elements to the amounts of frequency adjustments.

Thirdly, the ion-beam irradiation time for each element is determined from the determined amount of frequency adjustment by using the correlation between the irradiation time and the amount of frequency changes. Then, an ion beam is irradiated on each element during the obtained irradiation time. With this method, the frequencies of the plurality of elements disposed on the piezoelectric substrate can be individually adjusted. As a result, frequency variations in the piezoelectric substrate are minimized.

Moreover, since the correlation that is determined in advance is used to obtain the ion-beam irradiation time for each element and the ion beam is irradiated during the obtained irradiation time, the frequency of each element can be set to be close to a target value with a one-shot or one-time only irradiation. In other words, unlike the conventional method, it is unnecessary to repeat ion-beam irradiation and frequency measurement. Accordingly, in preferred embodiments of the present invention, the frequency value of each element can be adjusted to the target value with high accuracy in a short time.

When an ion beam from the ion gun is irradiated onto the plurality of electrodes, according to the irradiated positions on the electrodes, the current density varies. Thus, in order to eliminate frequency variations due to positional variations, preferably, the current density distribution of the ion beam is measured in advance to correct the ion-beam irradiation time obtained from the correlation according to the current density. With this arrangement, the amount of etching performed in a wide range by the ion beam is stabilized, thereby greatly increasing frequency concentration.

In addition, when the ion beam is continuously irradiated, the current density reduces with the passage of time since the grid of an ion-gun is worn out. Changes in the current density occurring with the passage of time increase frequency variations in the piezoelectric substrate. In this case, as mentioned above, the irradiation time can be corrected.

On the other hand, since the irradiation time is prolonged, equipment performance is deteriorated. Thus, preferably, after measuring the current density of the ion beam, the measured current density is compared with a maximum and a minimum. When the current density is over the maximum and below the minimum, the intensity of the ion beam may be adjusted. In other words, when the current density is below the minimum, the intensity of the ion gun, that is, by increasing the value of a current discharged from the ion gun, the absolute value of the current density is corrected to be within a range of the maximum to the minimum. As a result, the frequency concentration can be greatly improved. In contrast, when the current density is over the maximum, the value of the current discharged from the ion gun will be decreased.

The current density of the ion beam may be measured in each piezoelectric substrate or in each product lot, in advance, afterwards, or at intervals of certain periods of time.

In various preferred embodiments of the present invention, it is preferable to individually vary the ion-beam irradiation time for each of the elements in the piezoelectric substrate. Thus, preferably, whereas the ion beam is continuously irradiated, there are disposed shutters for shielding and releasing the ion beam to adjust the irradiation time by opening and closing the shutters disposed in a manner adapted to each element.

With the shutters, while continuously irradiating the ion beam, the irradiation time for each element can be freely varied. Accordingly, the frequency adjustment can be performed with high accuracy.

Other features, steps, elements, characteristics and advantages of the present invention will become more apparent from the following detailed description of preferred embodiments with reference to the attached drawings.

DETAILED DESCRIPTION OF PREFERRED EMBODIMENTS

Figure 1:
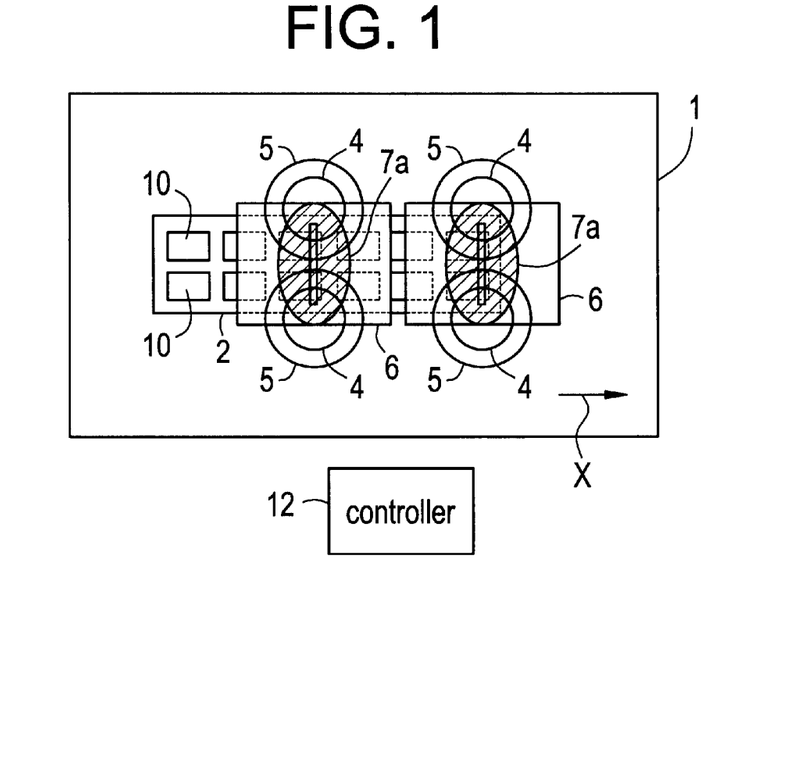
FIG. 1 shows a schematic plan view of a frequency adjustment apparatus according to a preferred embodiment of the present invention.
Figure 2:
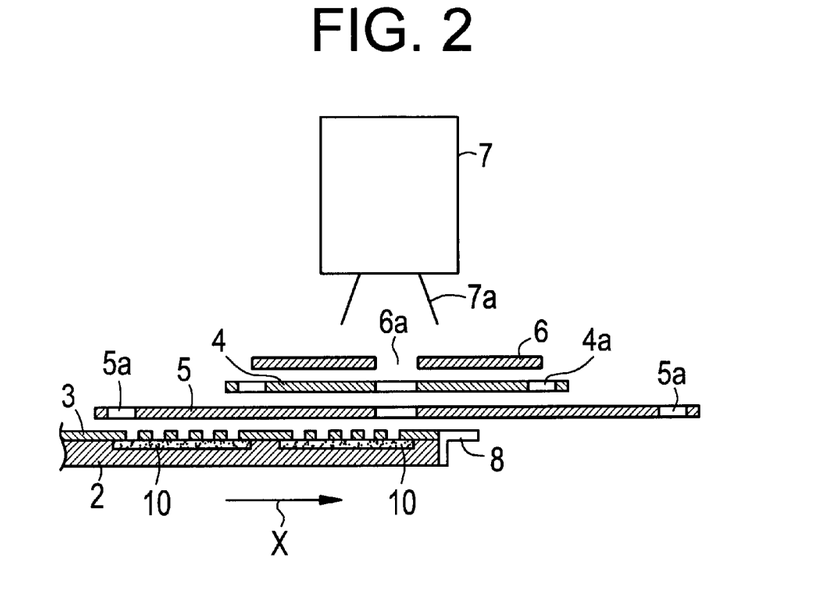
FIG. 2 shows a partial sectional view of the frequency adjustment apparatus shown in FIG. 1.
Figure 3:
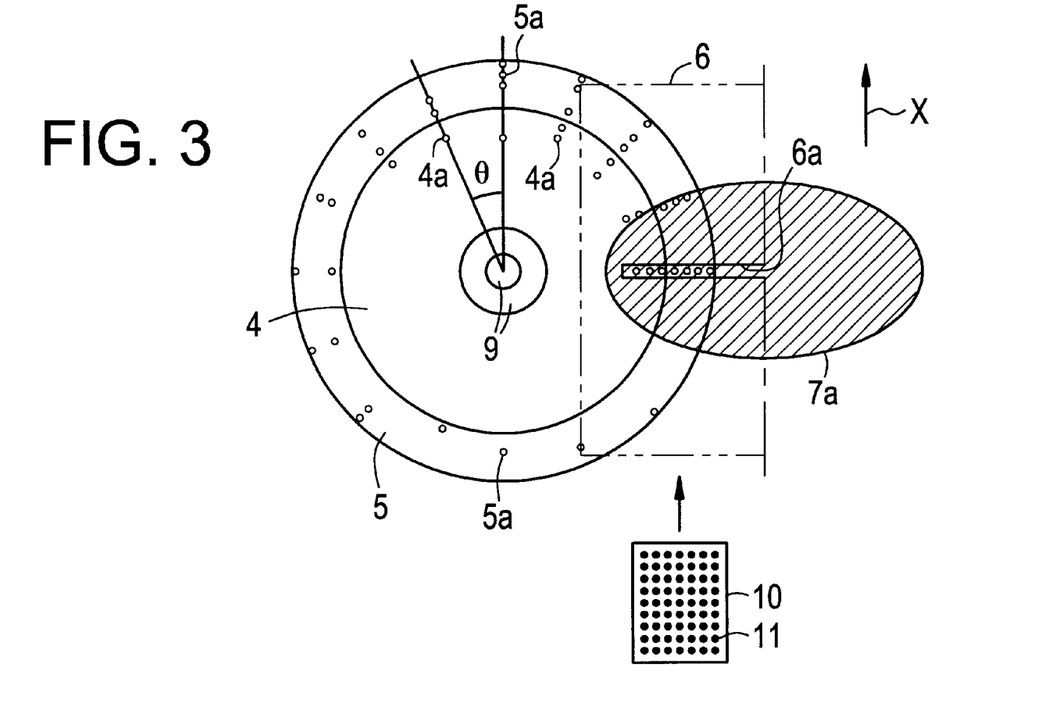
FIG. 3 shows a partial plan view of the frequency adjustment apparatus shown in FIG. 1.

Each of FIGS. 1 to 3 shows a frequency adjustment apparatus according to a preferred embodiment of the present invention.

Figure 4:
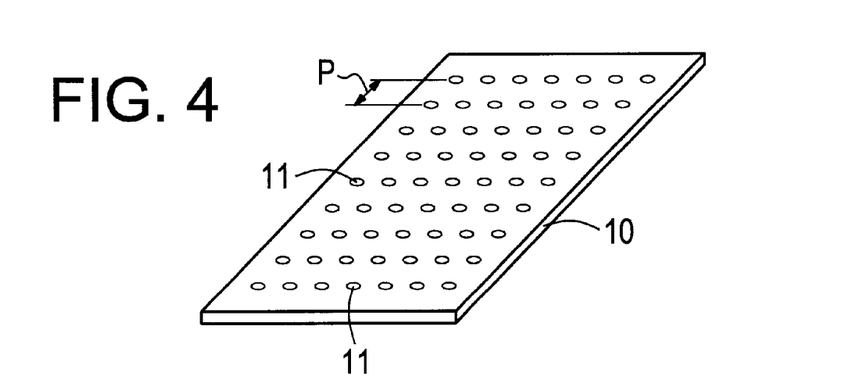
FIG. 4 shows a perspective view of a piezoelectric substrate subjected to frequency adjustments by the frequency adjustment apparatus shown in FIG. 1.

In this apparatus shown in FIG. 4, a plurality of electrodes 11 is arranged in insular forms on a piezoelectric substrate 10 and etched by an ion beam to adjust the frequencies of elements formed between the electrodes 11 that are mutually opposed to each other via the piezoelectric substrate 10. The frequencies of the elements that are formed in the piezoelectric substrate 10 are set in advance to be slightly low and are adjusted by the frequency adjustment apparatus to achieve desired frequencies.

The apparatus shown in FIG. 4 preferably includes a vacuum chamber 1, a palette 2 arranged movably in the vacuum chamber 1 to retain the piezoelectric substrate 10 in a predetermined position, a mask 3 for masking parts except the electrodes 11 on the piezoelectric substrate 10 contained in the palette 2, disk-shaped shutters 4 and 5, slit plates 6, ion guns 7, and a controller 12. In this preferred embodiment, with respect to a single palette 2, in total, four shutters 4 and 5 are arranged in such a manner that a pair of shutters 4 and 5 are formed on the right and left sides, and two slit plates 6 and two ion guns 7 are arranged fore and after.

Figure 5:
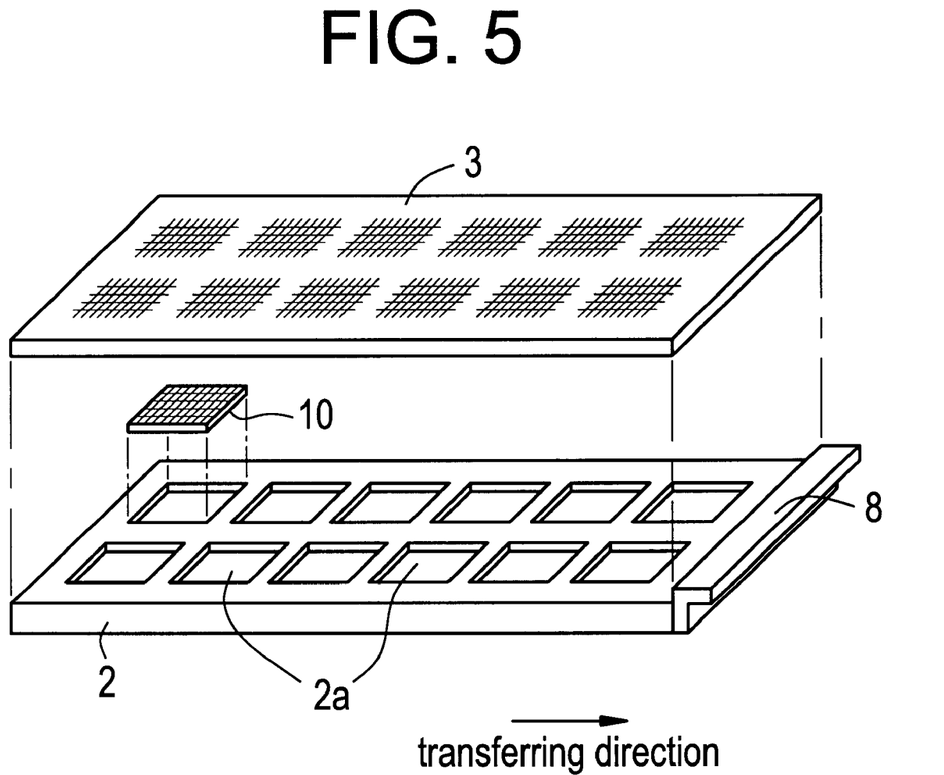
FIG. 5 shows a perspective view for illustrating a palette and a mask used in the frequency adjustment apparatus shown in FIG. 1.

The palette 2 is driven by a carrier having a high accuracy for positioning and is moved in an X direction by an electrode pitch P on the piezoelectric substrate 10. As shown in FIG. 5, the palette 2 has a plurality of recesses 2a capable of separately containing a plurality of piezoelectric substrates 10 (for example, 12 pieces in this preferred embodiment), and the electrodes 11 on the piezoelectric substrate 10 are aligned in a direction that is substantially perpendicular to the carrying direction. The mask 3 is mounted in a predetermined position with respect to the palette 2.

A sensor 8 for measuring the current density of the ion gun 7 is disposed at the front edge of the palette 2. With this arrangement, every time such a palette 2 passes under the ion gun 7, the sensor 8 measures the current density of the ion gun 7, a current density distribution at each point, and changes in ion-beam intensity occurring with the passage of time.

In the upper portion of the vacuum chamber 1, the disk-shaped shutters 4 and 5, which permit an ion beam from the ion gun 7 to be selectively irradiated onto the electrodes 11 of the piezoelectric substrates 10 on the palette 2, are independently disposed in a rotatable manner with a coaxial member 9 in the coaxial position. The lower shutter 5 preferably includes a disk-shaped member having a diameter that is greater than the diameter of the upper shutter 4. As shown in FIG. 3, ion-beam-passing holes 5a are formed in the lower shutter 5 in a substantially perpendicular direction at intervals of a predetermined angle θ, for example, at intervals of approximately 22.5 degrees. Of the ion-beam-passing holes 5a aligned in the substantially perpendicular direction, three holes 5a formed within a range of the diameter of the upper shutter 4 are all open. Additionally, the ion-beam-passing holes 5a formed outside the range of the diameter of the upper shutter 4 are open with 15 different patterns in angular positions. That is, there is disposed one position where four holes 5a are open, four positions where three holes 5a are open, six positions where two holes 5a are open, four positions where one hole 5a is open. Note that there is one position where no hole is provided.

In addition, in the upper shutter 4, there are formed ion-beam-passing holes 4a aligned in the substantially perpendicular direction at the intervals of a predetermined angle θ, for example, at the intervals of about 22.5 degrees, in a manner that the holes 4a vertically correspond to the holes 5a formed within the diameter range of the upper shutter 4.

The ion-beam-passing holes 4a of the upper shutter 4 are open with seven different patterns in angular positions. That is, there is one position where three holes 4a are open, three positions where two holes 4a are open, three positions where one hole 4a is open, and there is no open hole in the remaining positions.

The upper and lower shutters 4 and 5 are rotatably driven intermittently by an angle θ between the passing holes 4a and 5a via independent motors (not shown).

Above the upper shutter 4, the slit plates 6 are horizontally arranged. In each of the slit plates 6, there is formed a slit hole 6a in a direction that is substantially perpendicular to the direction in which the palette 2 is carried.

The width of the slit hole 6a is preferably set so as to allow an ion beam to be irradiated onto a single line of the aligned electrodes 11 on the piezoelectric substrate 10. The length of the slit hole 6a is preferably slightly greater than the width of the electrodes 11 of the two piezoelectric substrates 10 arranged in parallel.

FIG. 3 shows positions where seven ion-beam-passing holes 5a of the lower shutter 5 and three ion-beam-passing holes 4a of the upper shutter 4 correspond to the slit hole 6a.

The ion gun 7 continuously applies an ion beam 7a to regions indicated by oblique lines shown in FIGS. 1 and 3. The slit plates 6 and the shutters 4 and 5 shield all portions except targeted electrodes 11 on the piezoelectric substrates 10. As a result, the ion beam 7a is selectively applied onto the targeted electrodes 11.

A signal detected by the sensor 8 attached to the palette 2 is input to the controller 12, which controls carrying of the palette 2, opening and closing of the shutters 4 and 5, a current discharged from the ion gun 7, and other functions. The controller 12 stores in advance input data such as the correlation (calibration curve) between ion-beam irradiation times and the amounts of changes in the frequencies of the elements in the piezoelectric substrate 10, the current density of each point obtained when the calibration curve is made, and other features. This will be described in more detail below.

Figure 6:
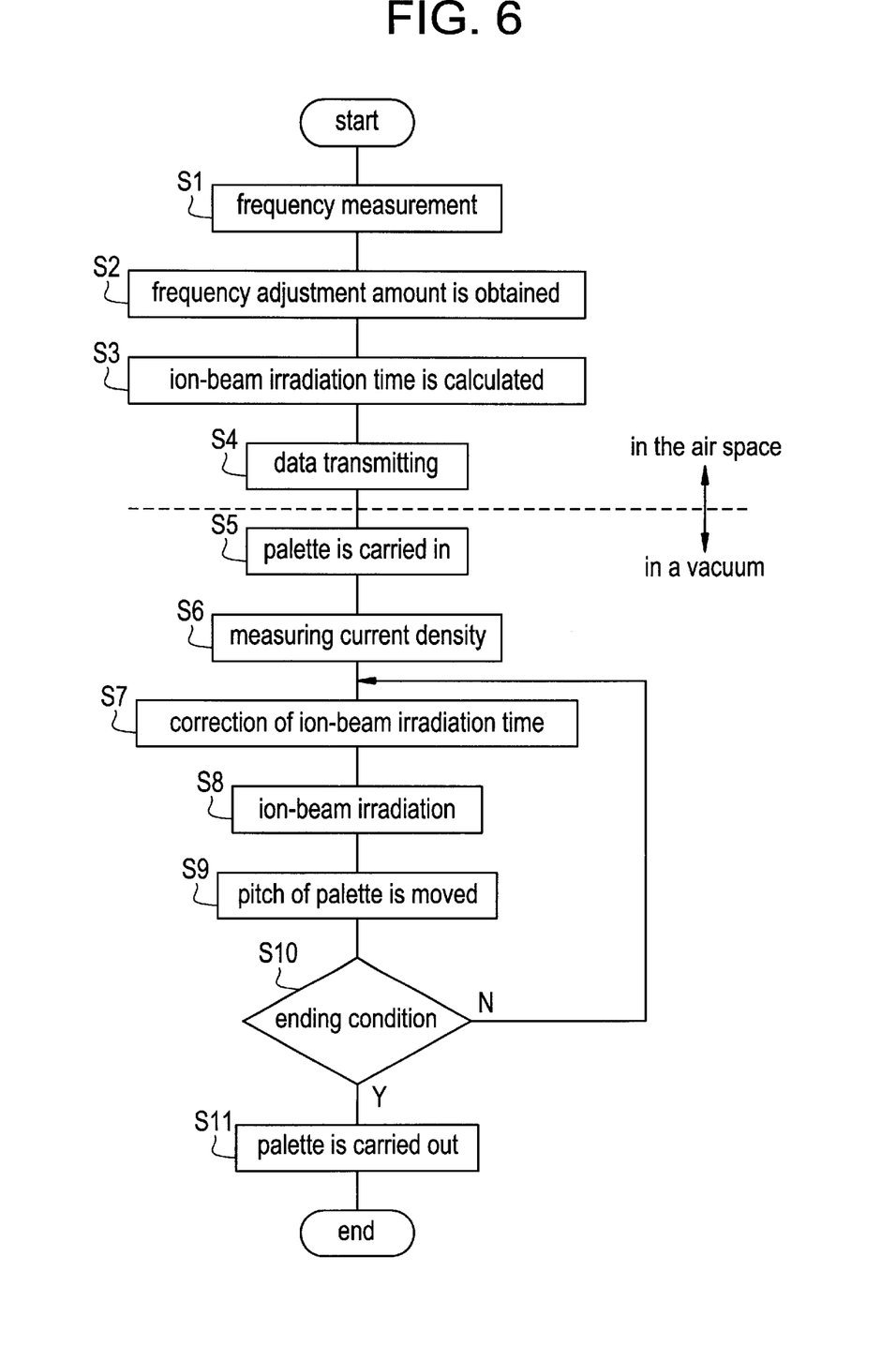
FIG. 6 shows a flowchart for illustrating the frequency adjustment method according to a preferred embodiment of the present invention.

Next, the frequency adjustment method according to preferred embodiments of the present invention will be illustrated with reference to FIG. 6.

First, the frequency of each element in the piezoelectric substrate 10 is measured (step S1). Specifically, a measurement terminal is contacted with the electrodes 11 mutually opposing via the piezoelectric substrate 10 to measure the resonance frequency or anti-resonance frequency of each element disposed between the mutually opposing electrodes 11 on the upper and lower surfaces of the piezoelectric substrate 10.

Next, from the difference between the measured frequency and a target frequency value, the amount of the frequency adjustment for the element is obtained (step S2).

Figure 7:
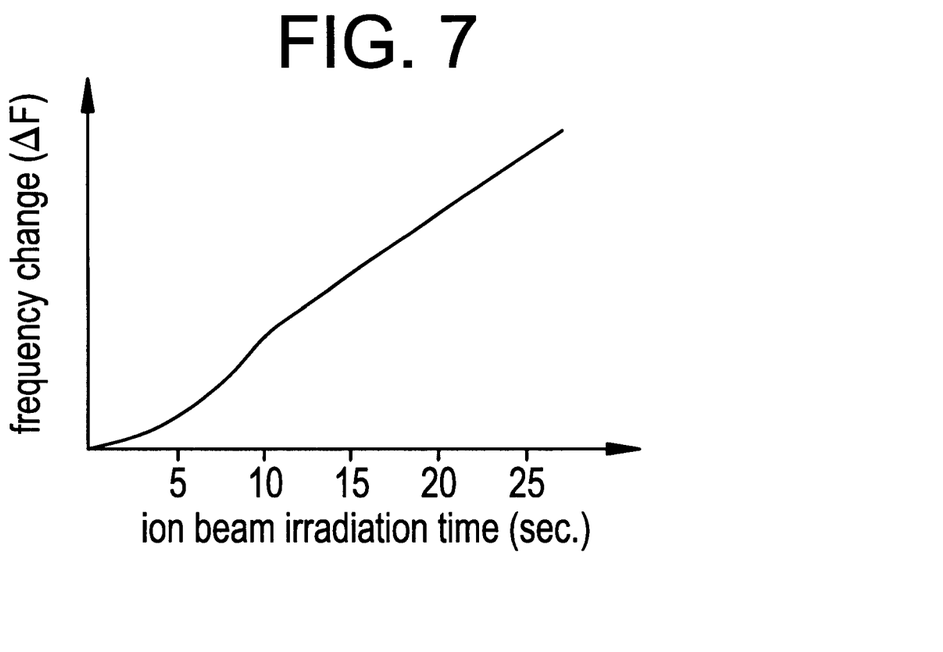
FIG. 7 shows a calibration curve used in the frequency adjustment method according to a preferred embodiment of the present invention.

Then, from the obtained amount of the frequency adjustment, with the use of a predetermined calibration curve, the ion-beam irradiation time for the element is calculated (step S3). The calibration curve is based on the correlation between the irradiation time and the amount of frequency changes experimentally obtained in advance by irradiating the ion beam 7a onto the piezoelectric substrate 10 with the ion gun 7. As shown in FIG. 7, the ion-beam irradiation time is approximately proportional to the frequency-change amount.

After calculating the ion-beam irradiation times for all the elements, the data of the calculated irradiation times is transmitted to the controller 12 (step S4). When the calibration curve is produced, the current density of each point is measured and the data of the measured density is also simultaneously sent to the controller 12.

The operations from step S1 to S4 described above are performed in the air space.

Next, the palette 2 containing the piezoelectric substrates 10 is carried into the vacuum chamber 1 (step S5). With the use of the sensor 8 attached to the front edge of the palette 2, corresponding to the alignment patterns of the elements inside the piezoelectric substrates 10, the current density of the ion beam 7a at each point is measured (step S6).

Figure 8:
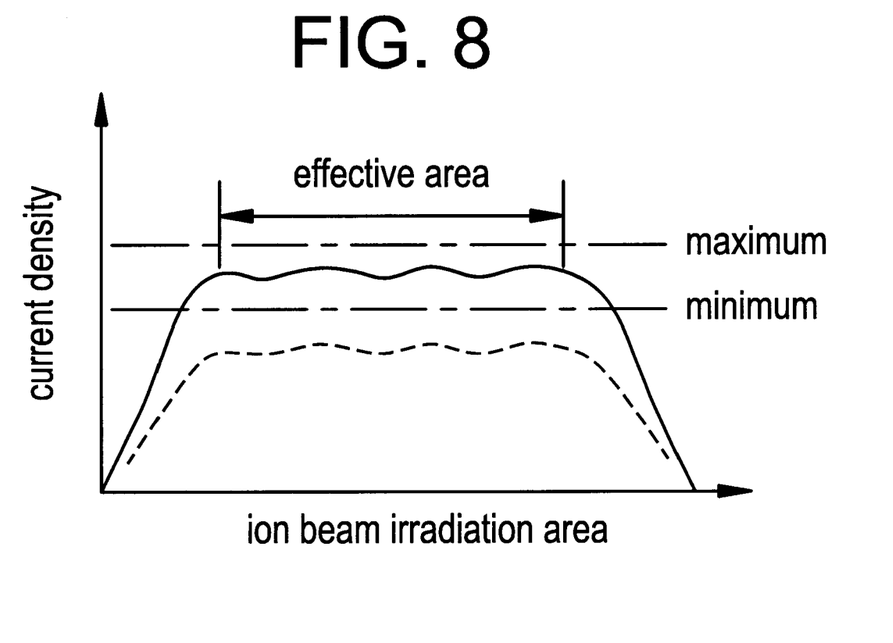
FIG. 8 shows a graph of the current density distribution of an ion beam.

The current density of the ion beam 7a, as shown in FIG. 8, is presented as a substantially trapezoidal density distribution. In the distribution, in order to position the electrodes 11 of the piezoelectric substrate 10 in an effective area having an almost uniform density distribution, areas having non-uniform distributions are shielded by the slit holes 6a of the slit plate 6. However, even within the effective area, since there are some variations in the density distribution, the sensor 8 detects the variations.

Next, according to the difference between the current density measured by the sensor 8 and the current density obtained when the calibration curve is produced, the ion-beam irradiation time at each point is corrected (step S7). For example, when the current density measured by the sensor 8 is higher than the current density obtained when the calibration curve is produced, the ion-beam irradiation time will be corrected to be shorter.

Then, during the corrected ion-beam irradiation time at each point on the piezoelectric substrate 10, the upper and lower shutters 4 and 5 are opened/closed. Consequently, the ion-beam irradiation time for each of the electrodes 11 is individually controlled to make frequency adjustments (step S8). With the frequency adjustments made in this manner, the frequency of each of the plurality of elements formed in the piezoelectric substrate 10 can be individually adjusted. Accordingly, frequency concentration inside the piezoelectric substrate 10 can be enhanced.

After the ion-beam irradiation on the single line of the electrodes 11 is completed, the palette 2 is moved by an electrode pitch P (step S9). Subsequently, steps 7 to 9 are repeated until an ending condition (step S10) is satisfied. Specifically, those steps are repeated until the ion-beam irradiation onto all of the piezoelectric substrates 10 contained in the palette 2 is completed.

After the completion of the ion-beam irradiation on all of the piezoelectric substrate 10 of the palette 2, the palette 2 is carried out from the vacuum chamber 1 (step S11) to end the operation.

The above explanation has been given on the precondition that the ion gun 7 usually generates an ion beam with a constant intensity. However, when the ion beam is continuously irradiated, as indicated by a broken line in FIG. 8, the current density is deteriorated with the passage of time since the grid of the ion gun 7 is worn out. When the current density changes with a lapse of time, the ion-beam irradiation time can be controlled by time to open and close the shutters 4 and 5 to reduce the variations in the amount of frequency adjustments. However, since the irradiation time is prolonged, the equipment performance is deteriorated. In addition, even with slight changes in the current density, it is necessary to change the ion-beam irradiation time. That is, the irradiation time needs to be frequently changed.

Thus, the sensor 8 attached to the front edge of the palette 8 measures the current density of the ion beam to compare the measured current density with a maximum value and a minimum value (see FIG. 8). When the current density exceeds the maximum and minimum values, the intensity of the ion beam is adjusted. More specifically, when the current density is lower than the minimum value, by increasing the value of a current discharged from the ion gun, the absolute value of the current density is corrected within the maximum and minimum values. In contrast, when the current density is higher than the maximum value, the value of the current discharged from the ion gun is reduced. In this manner, by correcting the absolute value of the current density, the amount of frequency adjustments can be stabilized and the equipment performance is greatly improved.

Since the wearing of the grid gradually occurs, the above correction may be made, for example, every time another palette 2 is carried into the vacuum chamber 1, or the correction may be made for every multiple palettes 2. Additionally, in order to measure the current density once at each certain time interval, another measurement apparatus may be arranged in the vacuum chamber 1.

Figure 9:
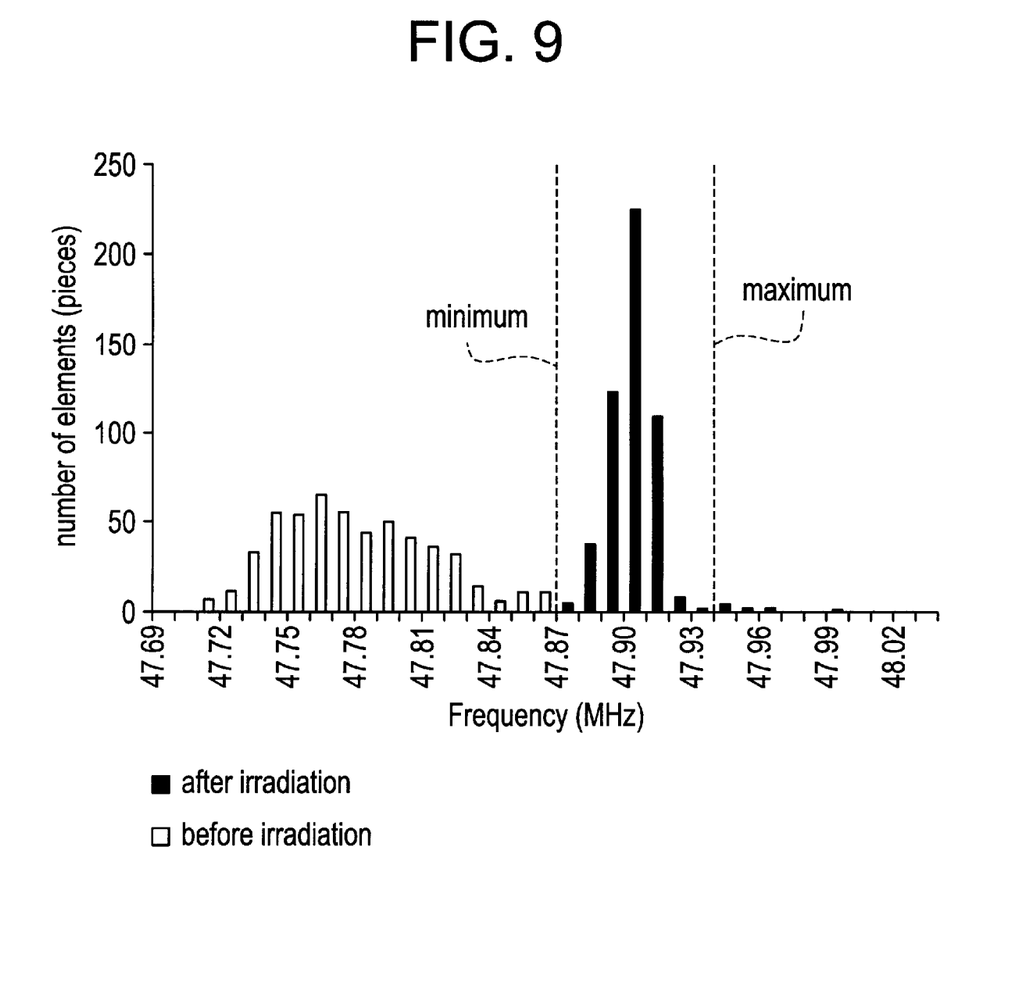
FIG. 9 shows the graph of frequency distributions obtained before and after the irradiation of an ion beam.

FIG. 9 shows frequency distributions obtained before and after the ion-beam irradiation performed by the frequency adjustment method according to preferred embodiments of the present invention.

As shown in the figure, it is seen that frequency concentration after the irradiation increases as compared with before the irradiation.

In the above-described preferred embodiment, the disk-shaped rotatable shutters 4 and 5 have been used as shutters. However, the present invention is not restricted to this type of shutter, and any kind of shutter can be used as long as can shield/release an ion beam in each electrode position.

As described above, in various preferred embodiments of the present invention, the frequency of each element disposed on the piezoelectric substrate is measured, the amount of frequency adjustments of each element is determined based on the difference between the measured frequency and a target value, the ion-beam irradiation time for each element is determined from the correlation between the ion-beam irradiation time determined in advance and the amount of frequency changes, and the ion beam is irradiated onto each element during the determined irradiation time. With this arrangement, in the piezoelectric substrate yet to be completed as a product, the frequency adjustments for each element can be individually performed. As a result, the equipment performance is greatly improved and frequency variations occurring in the piezoelectric substrate are minimized.

Furthermore, based on the correlation obtained in advance, the ion-beam irradiation time for each element is obtained to irradiate an ion beam only during the obtained irradiation time. Accordingly, unlike the conventional art, it is unnecessary to repeat ion-beam irradiation and frequency measurement. Thus, the frequency of each element can be set close to a target value with high accuracy in a short time.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for adjusting the frequency of a piezoelectric resonator, in which the frequency of each of elements disposed on a piezoelectric substrate is adjusted by irradiating an ion beam onto a plurality of electrodes provided on the piezoelectric substrate to etch the electrodes, the method comprising the steps of:
   determining a correlation between time for ion-beam irradiation and the amount of frequency changes;
   measuring the frequency of each of the elements disposed on the piezoelectric substrate;
   determining the amount of frequency adjustment for each of the elements based on a difference between the measured frequency value and a target frequency value;
   determining an ion-beam irradiation time for each of the elements based on the determined amount of frequency adjustment by using the correlation;
   irradiating an ion beam onto each of the elements during the determined ion-beam irradiation time;
   measuring the current density of the ion beam;
   comparing the measured current density value with a maximum value and a minimum value; and
   adjusting the intensity of the ion beam when the current density is above the maximum value and below the minimum value.

2. A method for adjusting the frequency of a piezoelectric resonator according to claim 1, wherein when the ion beam is simultaneously irradiated onto the plurality of electrodes provided on the piezoelectric substrate to adjust the frequency of each of the elements, a current density of the ion beam in the position of each of the electrodes is measured in advance to correct the correlation between the ion-beam irradiation time and the amount of the frequency changes based on the measured current density distribution.

3. A method for adjusting the frequency of a piezoelectric resonator according to claim 1, wherein in the step of irradiating the ion beam onto each of the elements during the determined ion-beam irradiation time, whereas the ion beam is continuously irradiated, the irradiation time is adjusted by opening and closing shutters for shielding and releasing the ion beam, the shutters being arranged in a manner adapted to each of the elements.

4. A method for adjusting the frequency of a piezoelectric resonator according to claim 1, wherein the plurality of electrodes are arranged in insular forms on the piezoelectric substrate.

5. A method for adjusting the frequency of a piezoelectric resonator according to claim 1, wherein in the step of measuring the frequency of each of the elements disposed on the piezoelectric substrate, the resonance frequency of each of the elements is measured.

6. A method for adjusting the frequency of a piezoelectric resonator according to claim 1, wherein in the step of measuring the frequency of each of the elements disposed on the piezoelectric substrate, the anti-resonance frequency of each of the elements is measured.

7. A method for adjusting the frequency of a piezoelectric resonator according to claim 1, wherein the step of determining an ion-beam irradiation time for each of the elements is performed based on the determined amount of frequency adjustment by using the correlation and also based on a predetermined calibration curve.

8. A method for adjusting the frequency of a piezoelectric resonator according to claim 7, wherein the calibration curve is based on the correlation between the irradiation time and the amount of frequency changes.

9. A method for adjusting the frequency of a piezoelectric resonator according to claim 1, further comprising the step of measuring the current density of the ion beam at each location of the electrodes.

10. A method for adjusting the frequency of a piezoelectric resonator according to claim 9, further comprising the step of changing the ion-implantation time based on the measured current density.

11. A method for adjusting the frequency of a piezoelectric resonator according to claim 9, wherein the ion-implantation time is changed for each of the plurality of elements disposed on the piezoelectric substrate based on the measured current density.

12. A method for adjusting the frequency of a piezoelectric resonator according to claim 10, wherein the the ion-beam irradiation time is changed for each of the electrodes to make frequency adjustments for each of the elements disposed on a piezoelectric substrate.

13. A method for adjusting the frequency of a piezoelectric resonator according to claim 9, further comprising using a slit plate to shield certain areas of the piezoelectric substrate, wherein areas of the piezoelectric substrate having non-uniform distributions of density are shielded by slit holes of the slit plate.

14. An apparatus for adjusting the frequency of a piezoelectric resonator having a plurality of elements and electrodes disposed on a piezoelectric substrate, the apparatus comprising:

a vacuum chamber;

a palette arranged movably in the vacuum chamber to retain the piezoelectric substrate in a predetermined position;

a plurality of ion guns arranged to apply ion-beam irradiation to the piezoelectric resonator to achieve frequency changes in the piezoelectric resonator and the elements disposed thereon; and a mask for masking parts except the electrodes on the piezoelectric substrate contained on the palette during ion-beam implantation; and a controller that is operative to determine a correlation between time for ion-beam irradiation and the amount of frequency changes, measure the frequency of each of the elements disposed on the piezoelectric substrate, determine the amount of frequency adjustment for each of the elements based on a difference between the measured frequency value and a target frequency value, determine an ion-beam irradiation time for each of the elements based on the determined amount of frequency adjustment by using the correlation and causing the palette to move the piezoelectric resonator past the plurality of ion guns for irradiating an ion beam onto each of the elements during the determined ion-beam irradiation time.

15. An apparatus according to claim 14, further comprising a plurality of shutters arranged to be opened and closed to vary the irradiation time.

16. An apparatus according to claim 15, wherein at least one of the plurality of shutters includes a plurality of ion-beam-passing holes extending in a substantially perpendicular direction at intervals of approximately 22.5 degrees.

17. An apparatus according to claim 16, wherein the shutters are arranged to be rotatably driven intermittently by an angle $\theta$ between the ion-beam-passing holes.

18. An apparatus according to claim 14, further comprising a pluarlity of slit plates arranged to allow an ion beam to be irradiated from the ion guns onto a single line of the electrodes on the piezoelectric substrate.

19. An apparatus according to claim 14, further comprising a sensor arranged to measure the current density of the ion guns for each electrode position on the piezoelectric substrate.

* * * * *